(12) United States Patent
Cheng et al.

(10) Patent No.: US 9,865,459 B2
(45) Date of Patent: Jan. 9, 2018

(54) PLASMA TREATMENT TO IMPROVE ADHESION BETWEEN HARDMASK FILM AND SILICON OXIDE FILM

(71) Applicant: Applied Materials, Inc., Santa Clara, CA (US)

(72) Inventors: Rui Cheng, Santa Clara, CA (US); Pramit Manna, Sunnyvale, CA (US); Abhijit Basu Mallick, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/094,512

(22) Filed: Apr. 8, 2016

(65) Prior Publication Data

US 2016/0314960 A1 Oct. 27, 2016

Related U.S. Application Data

(60) Provisional application No. 62/151,140, filed on Apr. 22, 2015.

(51) Int. Cl.
*H01L 21/02* (2006.01)
*H01L 21/033* (2006.01)
*H01L 21/32* (2006.01)
*H01L 21/3105* (2006.01)

(52) U.S. Cl.
CPC .... *H01L 21/0234* (2013.01); *H01L 21/02274* (2013.01); *H01L 21/0332* (2013.01); *H01L 21/3105* (2013.01); *H01L 21/32* (2013.01); *H01L 21/02115* (2013.01)

(58) Field of Classification Search
CPC .................................................. H01L 21/0234
USPC .......................................................... 438/778
See application file for complete search history.

(56) References Cited

U.S. PATENT DOCUMENTS

| | | | | |
|---|---|---|---|---|
| 5,866,920 A | * | 2/1999 | Matsumoto | H01L 21/31144 257/63 |
| 6,091,081 A | * | 7/2000 | Matsubara | H01L 21/312 257/52 |
| 6,104,092 A | * | 8/2000 | Matsubara | H01L 21/32051 257/646 |
| 2007/0231746 A1 | * | 10/2007 | Iordanoglou | G03F 7/091 430/305 |
| 2009/0061622 A1 | * | 3/2009 | Ahn | H01L 21/0332 438/656 |
| 2009/0199768 A1 | | 8/2009 | Verhaverbeke et al. | |
| 2009/0201722 A1 | | 8/2009 | Giridhar | |
| 2009/0286403 A1 | * | 11/2009 | Kim | H01L 21/02304 438/703 |
| 2010/0003825 A1 | * | 1/2010 | Ogasawara | H01J 37/32091 438/710 |

(Continued)

*Primary Examiner* — Moazzam Hossain
(74) *Attorney, Agent, or Firm* — Patterson + Sheridan, LLP (57) ABSTRACT

The present disclosure relates to methods for improving adhesion between a hardmask layer and a subsequent layer on the hardmask layer. Particularly, embodiment of the present disclosure relates to methods for improving adhesion between a metal-doped amorphous carbon layer and a mask layer, such as a silicon oxide layer, a silicon nitride layer, or an amorphous silicon layer. One embodiment of the present disclosure includes performing a plasma treatment to the metal-doped amorphous carbon layer.

21 Claims, 3 Drawing Sheets

(56) References Cited

U.S. PATENT DOCUMENTS

| | | | |
|---|---|---|---|
| 2010/0081286 A1* | 4/2010 | Kim | H01L 21/31122 |
| | | | 438/710 |
| 2010/0096256 A1 | 4/2010 | Nalamasu et al. | |
| 2010/0098873 A1 | 4/2010 | Verhaverbeke et al. | |
| 2011/0308942 A1 | 12/2011 | Liu et al. | |
| 2012/0015521 A1 | 1/2012 | Yu et al. | |
| 2012/0149152 A1* | 6/2012 | Tsai | B81C 1/00333 |
| | | | 438/113 |
| 2012/0164844 A1* | 6/2012 | Kakimoto | C23C 16/402 |
| | | | 438/770 |
| 2013/0302996 A1 | 11/2013 | Reilly et al. | |
| 2014/0017518 A1 | 1/2014 | Verhaverbeke et al. | |
| 2014/0087486 A1* | 3/2014 | Vegh | H01L 21/31116 |
| | | | 438/4 |
| 2014/0120701 A1* | 5/2014 | Basker | H01L 29/66795 |
| | | | 438/478 |
| 2015/0126035 A1* | 5/2015 | Diao | H01J 37/321 |
| | | | 438/710 |
| 2015/0200094 A1 | 7/2015 | Underwood et al. | |
| 2016/0027659 A1* | 1/2016 | Hong | H01L 21/0335 |
| | | | 257/774 |
| 2016/0225632 A1* | 8/2016 | Shaikh | H01L 21/3081 |

* cited by examiner

PLASMA TREATMENT TO IMPROVE ADHESION BETWEEN HARDMASK FILM AND SILICON OXIDE FILM

CROSS-REFERENCE TO RELATED APPLICATIONS

This application claims priority to U.S. Provisional Patent Application Ser. No. 62/151,140, filed on Apr. 22, 2015, which herein is incorporated by reference.

BACKGROUND

Field

Embodiments of the present disclosure generally relate to the fabrication of integrated circuits and particularly to patterning hardmask materials, such as amorphous carbon.

Description of the Related Art

Development of etch selective hardmask materials is an important task for patterning new generation NAND (negative-AND) and DRAM (dynamic random-access memory) devices. Carbon-based materials, such as amorphous carbon (denoted as a-C), has been proved to be an effective material serving as etch hardmask for silicon oxide, silicon nitride, poly-crystalline silicon, or metal (e.g., aluminum) materials due to its chemical inertness, optical transparency, and good mechanical properties. During fabrication, an additional mask layer, such as silicon oxide, silicon nitride, or energy sensitive layer, may be used to pattern the hardmask layer.

However, poor adhesion has been observed between the amorphous carbon hardmask layer and the additional mask layer, such as a silicon oxide layer. The poor adhesion may result in undesired particle problems or low quality patterning.

Therefore, there is a need in the art for improving adhesion between a hardmask layer and a subsequent layer.

SUMMARY

Embodiments of the present disclosure generally relate to the fabrication of integrated circuits and particularly to patterning a hardmask layer.

In one embodiment, a method of processing a substrate in a processing chamber is provided. The method includes positioning a substrate in a process chamber, wherein a metal-doped amorphous carbon layer is formed on a top surface of the substrate, performing a plasma treatment to the metal-doped amorphous carbon layer, and depositing a mask layer over the treated metal-doped amorphous carbon layer.

Another embodiment provides a method of processing a substrate. The method includes forming a metal-doped amorphous carbon layer over a surface of the substrate, exposing the metal-doped amorphous carbon layer to a treatment gas, depositing a silicon oxide layer over the metal-doped amorphous carbon layer, forming in the silicon oxide layer a defined pattern consisting of through openings, transferring the defined pattern to the metal-doped amorphous carbon layer using the silicon oxide layer as a mask, and transferring the defined pattern to an underlying layer beneath the metal-doped carbon layer using the metal-doped carbon layer as a mask.

Another embodiment provides a method for processing a substrate. The method includes exposing a substrate to a first gas mixture comprising a metal-containing precursor, decomposing the first gas mixture in the processing chamber to form a metal-doped carbon layer over a surface of the substrate, exposing the metal-doped carbon layer to a treatment gas, generating a plasma of the treatment gas, and exposing the metal-doped carbon layer to a second gas mixture to form a silicon oxide layer over the metal-doped carbon layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to the fabrication of integrated circuits and particularly to patterning a hardmask layer, more particularly, to patterning a metal-doped amorphous carbon layer for use as a hardmask for etching the underlying layer, layer stack, or structure.

In various embodiments, a plasma treatment may be performed to a synthesis of amorphous carbon films doped with transition metals prior to forming an additional mask layer thereon. The plasma treatment may be performed by exposing the amorphous carbon films to a plasma of argon gas or hydrogen gas. Details of the disclosure and various implementations are discussed below

Exemplary Chamber Hardware for Deposition Process

Figure 1:
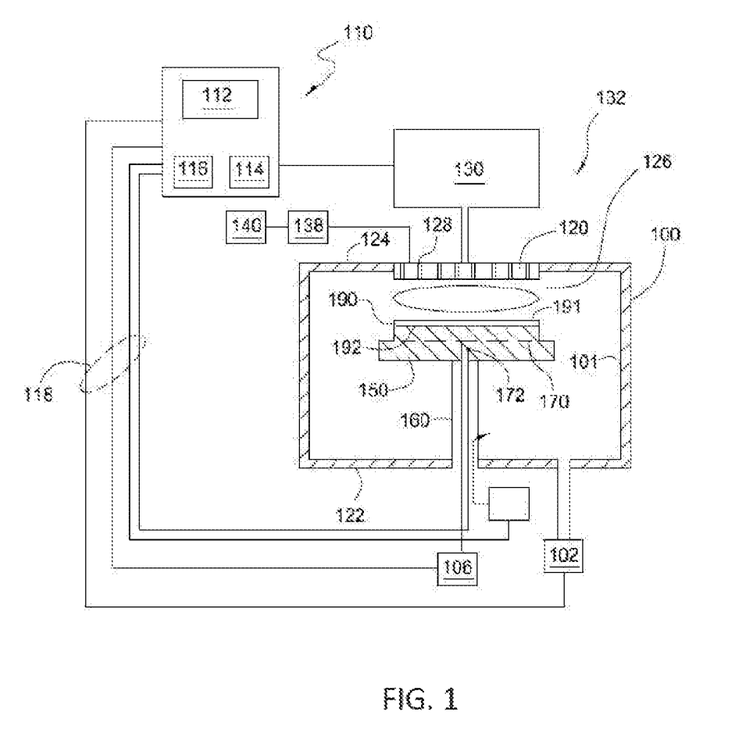
FIG. 1 depicts a schematic illustration of an apparatus that can be used for the practice of embodiments described herein.

FIG. 1 is a schematic representation of a substrate processing system 132, which can be used for plasma treatment of an amorphous carbon layer according to embodiments described herein. The substrate processing system 132 may also be used to deposit a doped amorphous carbon layer before a plasma treatment and/or to deposit a silicon oxide layer after the plasma treatment of the doped amorphous carbon layer.

Examples of suitable chamber include the CENTURA® systems which may use a DxZ™ process chamber, PRECISION 5000® systems, PRODUCER® systems, such as the PRODUCER SE™ process chamber and the PRODUCER GT™ process chamber, all of which are commercially available from Applied Materials, Inc., of Santa Clara, Calif. It is contemplated that the processes described herein may be performed on other substrate processing systems, including those from other manufacturers.

The substrate processing system 132 includes a process chamber 100 coupled to a gas panel 130 and a controller 110. The process chamber 100 generally includes a top 124, a side 101 and a bottom wall 122 that define an interior processing volume 126. A pedestal 150 is provided in the interior processing volume 126 of the process chamber 100. The pedestal 150 is supported by a stem 160 and may be typically fabricated from aluminum, ceramic, and other suitable materials. The pedestal 150 may be moved in a vertical direction inside the process chamber 100 using a displacement mechanism (not shown).

The pedestal 150 may include an embedded heater element 170 suitable for controlling the temperature of a substrate 190 supported on a surface 192 of the pedestal 150. The pedestal 150 may be resistively heated by applying an electric current from a power supply 106 to the heater element 170. The heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thereby maintaining the substrate 190 and the pedestal 150 at a substantially constant temperature during film deposition. The supplied electric current may be adjusted to selectively control the temperature of the pedestal 150 between about 100 degrees Celsius to about 700 degrees Celsius.

A temperature sensor 172, such as a thermocouple, may be embedded in the pedestal 150 to monitor the temperature of the pedestal 150 in a conventional manner. The measured temperature is used by the controller 110 to control the power supplied to the heater element 170 to maintain the substrate at a desired temperature.

A vacuum pump 102 is coupled to a port formed in the bottom of the process chamber 100. The vacuum pump 102 is used to maintain a desired gas pressure in the process chamber 100. The vacuum pump 102 also evacuates post-processing gases and by-products of the process from the process chamber 100.

The substrate processing system 132 may further include additional equipment for controlling the chamber pressure, for example, valves (e.g. throttle valves and isolation valves) positioned between the process chamber 100 and the vacuum pump 102 to control the chamber pressure.

A showerhead 120 having a plurality of apertures 128 is disposed on the top of the process chamber 100 above the pedestal 150. The apertures 128 of the showerhead 120 are utilized to introduce process gases into the process chamber 100. The apertures 128 may have different sizes, number, distributions, shape, design, and diameters to facilitate the flow of the various process gases for different process requirements. The showerhead 120 is connected to the gas panel 130 that allows various gases to supply to the interior processing volume 126 during process. A plasma may be formed from the process gas mixture exiting the showerhead 120 to enhance thermal decomposition of the process gases resulting in the deposition of material on a surface 191 of the substrate 190.

The gas panel 130 may also be used to control and supply various vaporized liquid precursors. While not shown, liquid precursors from a liquid precursor supply may be vaporized, for example, by a liquid injection vaporizer, and delivered to the process chamber 100 in the presence of a carrier gas. The carrier gas is typically an inert gas, such as nitrogen, or a noble gas, such as argon or helium. Alternatively, the liquid precursor may be vaporized from an ampoule by a thermal and/or vacuum enhanced vaporization process.

The showerhead 120 and substrate support pedestal 150 may form a pair of spaced apart electrodes in the interior processing volume 126. One or more RF power sources 140 provide a bias potential through a matching network 138 to the showerhead 120 to facilitate generation of plasma between the showerhead 120 and the pedestal 150. Alternatively, the RF power sources 140 and matching network 138 may be coupled to the showerhead 120, pedestal 150, or coupled to both the showerhead 120 and the pedestal 150, or coupled to an antenna (not shown) disposed exterior to the process chamber 100. In one embodiment, the RF power sources 140 may provide between about 100 Watts and about 3,000 Watts at a frequency of about 50 kHz to about 13.6 MHz. In another embodiment, the RF power sources 140 may provide between about 500 Watts and about 1,800 Watts at a frequency of about 50 kHz to about 13.6 MHz. The above process parameters are for substrates having a diameter of 300 mm. The process parameters may be adjusted for substrate size when processing larger or smaller substrates.

The controller 110 includes a central processing unit (CPU) 112, a memory 116, and a support circuit 114 utilized to control the process sequence and regulate the gas flows from the gas panel 130. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the substrate processing system 132 are handled through numerous signal cables collectively referred to as signal buses 118, some of which are illustrated in FIG. 1.

Other process chambers may also benefit from the present disclosure and the parameters listed above may vary according to the particular deposition chamber used to perform plasma treatment, form the amorphous carbon layer or the silicon oxide layer. For example, other process chambers may have a larger or smaller volume, requiring gas flow rates that are larger or smaller than those recited for process chambers available from Applied Materials, Inc.

Exemplary Fabrication Process for Hardmask

Figure 2A:
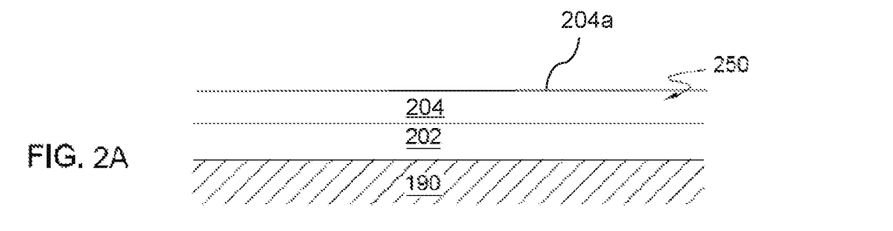
FIGS. 2A-2E illustrate schematic cross-sectional views of the substrate of FIG. 1 at different stages of an integrated circuit fabrication sequence for making a hardmask.

FIGS. 2A-2E illustrate schematic cross-sectional views of the substrate 190 of FIG. 1 at different stages of an integrated circuit fabrication sequence for patterning a hardmask. The substrate 190, as shown in FIGS. 1 and 2A, may have a substantially planar surface. Alternatively, the substrate may have patterned structures, a surface having trenches, holes, or vias formed therein. The substrate 190 may also have a substantially planar surface having a structure formed thereon or therein at a desired elevation. While the substrate 190 is illustrated in FIGS. 1 and 2 as a single body, it is understood that the substrate 190 may contain one or more material layers used in forming semiconductor devices such as metal contacts, trench isolations, gates, bitlines, or any other interconnect features. A substrate structure 250 denotes the substrate 190 together with other material layers formed on the substrate 190.

The substrate 190 may comprise one or more metal layers, one or more dielectric materials, semiconductor material, and combinations thereof utilized to fabricate semiconductor devices. For example, the substrate 190 may include an oxide material, a nitride material, a polysilicon material, or the like, depending upon application. In one embodiment where a memory application is desired, the substrate 190 may include the silicon substrate material, an oxide material, and a nitride material, with or without polysilicon sandwiched in between.

In another embodiment, the substrate 190 may include a plurality of alternating oxide and nitride materials (i.e., oxide-nitride-oxide (ONO)) deposited on a surface of the substrate (not shown). In various embodiments, the substrate 190 may include a plurality of alternating oxide and nitride materials, one or more oxide or nitride materials, polysilicon or amorphous silicon materials, oxides alternating with amorphous silicon, oxides alternating with polysilicon, undoped silicon alternating with doped silicon, undoped polysilicon alternating with doped polysilicon, or updoped amorphous silicon alternating with doped amorphous silicon. The substrate 190 may be any substrate or material surface upon which film processing is performed. For example, the substrate 190 may be a material such as crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low k dielectrics, and combinations thereof.

FIG. 2A illustrates a cross-sectional view of a substrate structure 250 having a material layer 202 that has been previously formed thereon. The material layer 202 may be a dielectric material, for example an oxide layer, such as a low-k carbon containing dielectric layer, a porous silicon oxycarbide low-k or ultra low-k dielectric layer. A metal-doped amorphous carbon layer 204 deposited on the substrate structure 250. The metal-doped amorphous carbon layer 204 may be useful as a pattern transfer layer, or a hard mask, for subsequent etch processes. The metal-doped amorphous carbon layer 204 has an enhanced etch selectivity over traditional hardmask materials, therefore, providing advantages when used as a hardmask. The metal-doped amorphous carbon layer 204 is formed on the substrate structure 250 by any suitable deposition process, such as via PECVD.

Figure 2B:
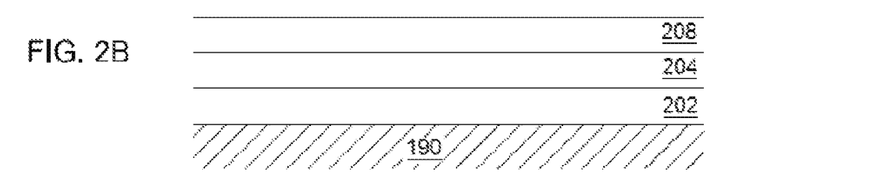

As shown in FIG. 2B, a mask layer 208 may be disposed over the metal-doped amorphous carbon layer 204. The mask layer 208 may be used to transfer a pattern from an energy sensitive resist material and to protect the metal-doped amorphous carbon layer 204 from energy sensitive resist. The mask layer 208 may be a silicon oxide layer deposited by chemical vapor deposition.

According to the present disclosure, a plasma treatment may be performed to the metal-doped amorphous carbon layer 204 prior to deposition of the mask layer 208. In one embodiment, a plasma of argon or hydrogen may be applied to the metal-doped amorphous carbon layer 204 prior to depositing the mask layer 208. Not to wish to be bound by theory, the plasma applied to the metal-doped amorphous carbon layer 204 may remove oxidized —COOH or OH ligands on a top surface 204a of the metal-doped amorphous carbon layer 204. After depositing the mask layer 208, metal-oxygen or metal-silicon or carbon-oxygen or carbon-silicon bonds may be formed between the interface between metal-doped amorphous carbon layer 204 and the mask layer 208 to improve adhesion between the metal-doped amorphous carbon layer 204 and a subsequent layer formed thereon.

Figure 2C:
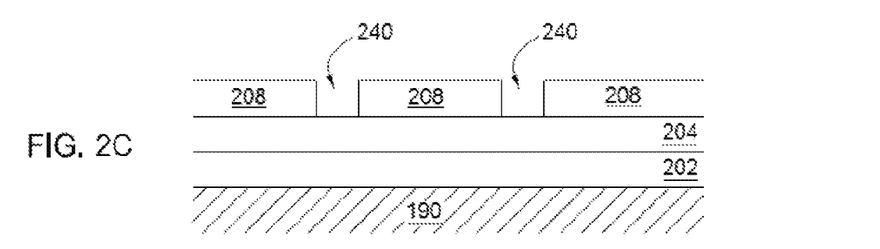

As depicted in FIG. 2C, a pattern may be formed on the mask layer 208. The pattern may be formed by photolithography technology. The pattern may include through openings 240 in the mask layer 208.

Figure 2D:
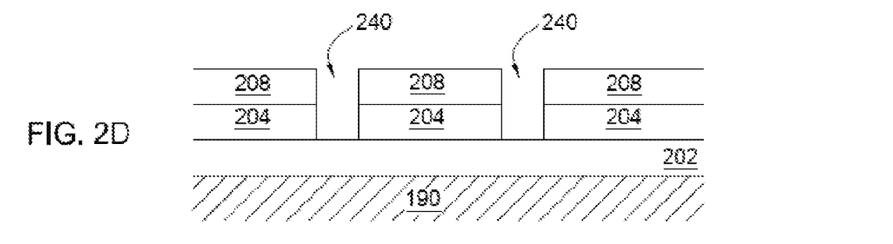

Thereafter, referring to FIG. 2D, the pattern defined in the mask layer 208 is transferred through the metal-doped amorphous carbon layer 204 using the patterned mask layer 208 as a mask. An appropriate chemical etchant is used that selectively etches the metal-doped amorphous carbon layer 204 over the mask layer 208 and the material layer 202, extending openings 240 to the surface of material layer 202. Appropriate chemical etchants may include ozone, oxygen or ammonia plasmas.

Figure 2E:
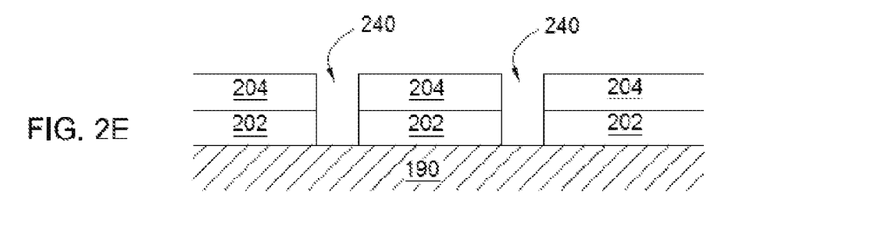

Referring to FIG. 2E, the pattern is then transferred through material layer 202 using the metal-doped amorphous carbon layer 204 as a hardmask. In this process step, an etchant is used that selectively removes material layer 202 over the metal-doped amorphous carbon layer 204, such as a dry etch, i.e. a non-reactive plasma etch. After the material layer 202 is patterned, the metal-doped amorphous carbon layer 204 can optionally be stripped from the substrate 190.

Exemplary Processes

Figure 3:
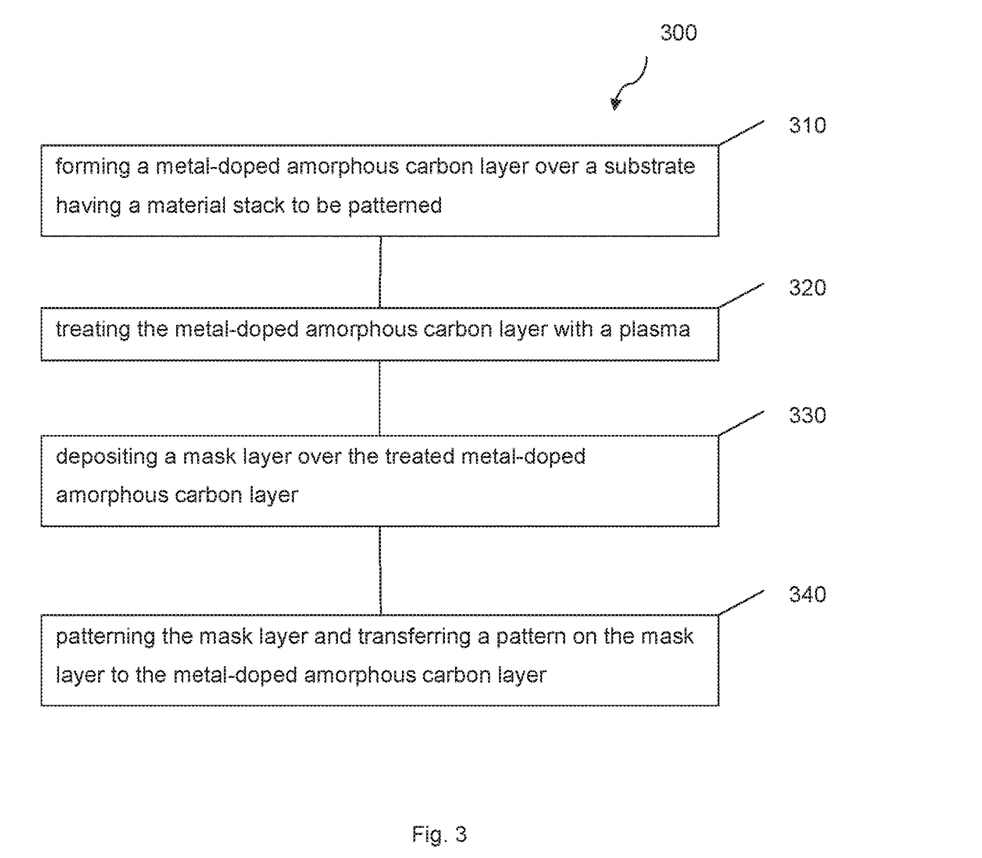
FIG. 3 is a process flow diagram depicting a method for patterning a hardmask according to embodiments of the present disclosure.

FIG. 3 is a process flow diagram depicting a method 300 for patterning with a hardmask, such as the metal-doped amorphous carbon layer 204 of FIGS. 2B-2E, according to embodiments of the present disclosure.

It should be noted that the sequence of steps illustrated in FIG. 3 are not intended to be limiting as to the scope of the disclosure described herein, since one or more steps may be added, deleted and/or reordered without deviating from the basic scope of the disclosure.

The method 300 begins at block 310 by forming a metal-doped amorphous carbon layer over a substrate having a material layer or a material stack deposited thereon. The substrate and the material layer may be the substrate 190 and the material layer 202 as discussed above with respect to FIGS. 2A-2E. The metal-doped amorphous carbon layer may be the metal-doped amorphous carbon layer 204 as discussed above with respect to FIGS. 2A-2E.

The metal-doped amorphous carbon layer may be formed by plasma enhanced chemical vapor deposition (PECVD). In one embodiment, the metal-doped amorphous carbon layer may be formed by flowing a gas mixture comprising a carbon-containing precursor and a metal-containing precursor to a process chamber, and generating a plasma of the gas mixture in the processing chamber to form the metal-containing amorphous carbon layer. In one embodiment, the gas mixture may include a reducing agent.

The metal-doped amorphous carbon layer may be formed in a processing chamber, such as the processing chamber of FIG. 1. The carbon-containing precursor may be flown into the interior processing volume 126 from a carbon precursor source and the metal-containing precursor may be flown into the interior processing volume 126 from a metal source. The carbon-containing precursor may be flowed from the gas panel 130 into the interior processing volume 126 through the showerhead 120. The metal-containing precursor may be flowed from the gas panel 130 into the interior processing volume 126 through the showerhead 120.

In one embodiment, the carbon-containing precursor, the metal-containing precursor, and the reducing agent are introduced into the processing volume before striking a plasma from the gas mixture. The carbon-containing precursor may be introduced into the processing volume for a longer time such as between about 5 seconds and about 30 seconds, for example about 15 seconds, which may vary depending upon the size of the substrate. The flowing of the carbon-containing precursor prior to the introduction of the metal-containing precursor and the reducing agent is believed to provide continuous thermal and pressure stabilization of the processing volume. While flowing the carbon-containing gas, the metal-containing precursor and the reducing agent are then flowing into the processing volume about 0.5 seconds to about 5 seconds, for example about 1 second to about 2 seconds. The flowing time may vary as long as the flow is just long enough for the metal-containing precursor and the reducing agent to start reaching the interior processing volume 126 prior to striking the RF plasma.

In another embodiment, the RF plasma may be generated prior to introduction of the metal-containing precursor and the reducing agent into the processing volume. Alternatively, the RF plasma may be turned off while continuing the flow of the carbon-containing precursor into the process volume prior to introduction of the metal-containing precursor and the reducing agent into the processing volume. In another embodiment, the carbon-containing precursor, the metal-containing precursor and the reducing agent may continue flow until a desired thickness of the metal-doped amorphous carbon layer is reached.

In one embodiment, a diluent gas and a plasma-initiating gas may be added to the gas mixture comprising the carbon-containing precursor and the metal-containing precursor. The plasma-initiating gas may be introduced into the processing volume before and/or at same time as generating the plasma of the carbon-containing precursor and the metal-containing precursor.

Alternatively, the metal-doped amorphous carbon layer may be formed by a plasma-enhanced atomic layer deposition (PEALD) process. Alternatively, the plasma-enhanced thermal decomposition or reactive process. For example, the substrate may be exposed to the gas mixture of the carbon-containing precursor, the metal-containing precursor, and the reducing agent in the processing volume, which is maintained at an elevated temperature suitable for thermal decomposition of the gas mixture. Other deposition processes, such as a metalorganic CVD (MOCVD) process, an evaporation process, or a physical vapor deposition (PVD) process, may also be used to form the deposited metal-doped amorphous carbon.

In any cases, the deposited metal-doped amorphous carbon layer 204 is a synthesis of amorphous carbon films doped with a desired metal, metal alloys, or metal carbides. In one embodiment where the metal-containing precursor contains transition metals (e.g., Ti, Zr, Hf, V, Nb, Ta, Cr, Mo, or W), the deposited amorphous carbon layer is expected to include, or to be doped with transition metal carbides having a stoichiometry corresponding to the following transition metal carbides: monotitanium carbide (TiC), monozirconium carbide (ZrC), monohafnium carbide (HfC), monovanadium carbide (VC), mononiobium carbide (NbC), monotantalum carbide (TaC), trichromium dicarbide ($Cr_3C_2$), dimolybdenum carbide ($Mo_2C$), or monotungsten carbide (WC). Depending upon the metal-containing precursor used, the deposited amorphous carbon layer may have one or more of the above specific transition metal carbides or may be a solid solution carbide of the above carbides, for example, the solid solution carbide may be a solid solution carbide containing W and Ti provided that the carbon stoichiometry corresponds to the stoichiometry of the above transition metal carbides (e.g., ($W_{0.5}$, $Ti_{0.5}$)C). In one embodiment, the deposited amorphous carbon layer is doped with WC.

Thickness of the metal-doped amorphous carbon layer 204 is variable depending upon the stage of processing. In one embodiment, the metal-doped amorphous carbon layer 204 may have a thickness from about 100 Å to about 20,000 Å, such as about 300 Å to about 5,000 Å. In some embodiments, the metal-doped amorphous carbon layer may have a thicker thickness of about 2000 Å to about 3000 Å, such that the metal-doped amorphous carbon layer can be consumed during the main etch process with excellent hardmask performance (e.g., good CD control and feature profile) while having thick enough amorphous carbon layer. The resulting metal-doped amorphous carbon hardmask may be used in various applications such as deep oxide contact etches, DRAM capacitor mold etches, and line and/or space etches. In the case of the line and space etch applications such as shallow trench isolation etch hardmask, gate etch hardmask and bitline etch hardmask, the metal-doped amorphous carbon layer may have about 400 Å to about 2,000 Å. Depending upon the etch selectivity of the dense and isolated regions, the thickness of the layers may be tuned accordingly.

In one embodiment, the carbon-containing precursor is a gaseous mixture of one or more hydrocarbon compounds. The hydrocarbon source may include a gas-phase hydrocarbon compound and/or a gas mixture including vapors of a liquid-phase hydrocarbon compound and a carrier gas. In one embodiment, the hydrocarbon compound has a general formula $C_xH_y$, where x has a range of between 1 and 10 and y has a range of between 2 and 22. Suitable hydrocarbon compounds may include, but are not limited to alkanes such as propane, methane, ethane, butane and its isomer isobutane, pentane and its isomers isopentane and neopentane, hexane and its isomers 2-methylpentane, 3-methylpentane, 2,3-dimethylbutane, and 2,2-dimethyl butane, and so on; alkenes such as ethylene, propylene, butylene and its isomers, pentene and its isomers, and the like, dienes such as butadiene, isoprene, pentadiene, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like. Additional suitable hydrocarbons may include alkynes such as acetylene, propyne, butyne, vinylacetylene and derivatives thereof. Additionally cyclic hydrocarbons, such as benzene, styrene, toluene, xylene, ethylbenzene, acetophenone, methyl benzoate, phenyl acetate, phenylacetylene ($C_8H_6$), phenol, cresol, furan, alpha-terpinene, cymene, 1,1,3,3,-tetramethylbutylbenzene, t-butylether, t-butylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene and the like. Halogenated hydrocarbons such as carbon tetrachloride ($CCl_4$), diiodomethane ($CH_2I_2$), chlorofluorocarbon (CFC), bromotrichloromethane ($BrCCl_3$), 1,1-dichloroethylene, bromobenzene, or derivatives thereof may also be used.

In some exemplary embodiments, acetylene ($C_2H_2$) or propyne ($C_3H_6$) is used as the carbon-containing precursor. $C_2H_2$ may be advantageous due to formation of more stable intermediate species which allows more surface mobility.

In some embodiments, the hydrocarbon compounds may be partially or completely doped derivatives of hydrocarbon compounds, including fluorine-, oxygen-, hydroxyl group-, and boron-containing derivatives of hydrocarbon compounds.

In some embodiments, the metal-containing precursor may be provided into the interior processing volume 126 along with the carbon-containing precursor via the apertures 128 of the showerhead 120, or via different gas passages (not shown) provided in the showerhead 120 or other suitable gas distribution components of the process chamber 100. Metal from the metal-containing precursor is reacted with the gaseous mixture of one or more hydrocarbon compounds from the carbon-containing precursor so that the deposited amorphous carbon films are doped with metals, metal alloys, or metal carbides.

In some embodiments, the metal-containing precursor may be a gaseous halide of a desired metal suitable for enhancing the hardness and wear resistance of the deposited amorphous carbon layer. Exemplary metal halides may include metal bromides, metal chlorides, metal fluorides, metal iodides, or any combination thereof. In some embodiments, the desired metal may include one or more of transition metals. Some exemplary transition metals may include, but is not limited to titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru), or osmium (Os). Other suitable metals, such as aluminum (Al), may also be used. As an example, the metal-containing precursor may include $TiCl_4$, $ZrCl_4$, $HfCl_4$, $VCl_5$, $NbCl_5$, $TaCl_5$, $TaF_5$, $CrCl_4$, $WCl_5$, $WCl_6$, $WF_6$, or $AlCl_3$.

Alternatively, the metal-containing precursor may be a metal organic compound. Exemplary metal organic compounds may include, but are not limited to metal dialkylamido compounds and/or metal cyclopentadienyl compounds. In some examples, bis(cyclopentadienyl)dimethyl zirconium and/or bis(cyclopentadienyl)dimethyl hafnium may be used to deposit metal doped carbon films. In some embodiments, the metal-containing precursor and the carbon-containing precursor may be the same precursor using the metal organic compound. In such a case, the metal-containing precursor may be a metal organic compound containing both metal and carbon. In embodiments where tungsten (W) is desired in the amorphous carbon layer, the suitable metal organic compound may contain at least tungsten and carbon. One exemplary metal organic compound containing tungsten and carbon is tungsten carbonyl compound. Suitable tungsten carbonyl compounds may include tungsten hexacarbonyl ($W(CO)_6$), tungsten pentacarbonyl compounds ($RW(CO)_5$), and tungsten tetracarbonyl compounds ($R_2W(CO_4)$), wherein R is one or more ligands replacing one or more carbonyl groups. In various examples, each R may be an alkylisonitrile group (R1-N≡C=) wherein each R1 is an alkyl group having from 4 to 8 carbon atoms, such as n-butyl, 1-ethylpropyl, 1,2 dimethylpropyl, isopentyl, 2-methylbutyl, 1-methylbutyl, n-pentyl, 1,3-dimethylbutyl, n-hexyl, 1-methylhexyl, and n-octyl. In cases where the metal organic compound is used, hydrocarbons as discussed in block 340 above may be used as co-reactants to control carbon to metal ratio.

The reducing agent may be introduced into the processing volume in an excited state and may be generated in situ or remotely. In either case, the reducing agent is used as a co-reactant and is capable of reducing the metal (or plurality of metals) in the growing film to a lower oxidation state, for example to an elemental metal state, or to a substantially elemental metal state, thereby forming a reduced metal in the deposited amorphous carbon layer. In some embodiments, the reducing agent should be able to remove halide and/or other impurities (e.g., oxygen) species from the growing film.

Suitable reducing agents may include, but are not limited to hydrogen, methane, ammonia, carbon monoxide, or the like. In some embodiments, the reducing agent may be provided in each deposition cycle of the deposition process, flowing together with the carbon-containing precursor and the metal-containing precursor. In some embodiments, the reducing agent may be provided before or after the flowing of the metal-containing precursor. In some embodiments, the reducing agent may be provided into the interior processing volume 126 at intervals during the deposition process. Alternatively, the reducing agent may be introduced into the interior processing volume 126 after a metal doped amorphous carbon layer is formed. That is, the deposited metal-doped amorphous carbon layer is exposed to the reducing agent to react with and reduce the metal in the deposited film.

The plasma-initiating gas may be a high ionization potential gas including, and not limited to, helium gas, hydrogen gas, nitrogen gas, argon gas and combinations thereof. The plasma-initiating gas may also be a chemically inert gas, such as helium gas, nitrogen gas, or argon gas. Suitable ionization potentials for gases are from about 5 eV (electron potential) to 25 eV. The plasma-initiating gas may be introduced into the processing chamber prior to the carbon-containing precursor, which allows a stable plasma to be formed and reduces the chances of arcing.

An inert gas is typically used as a dilution gas or a carrier gas to flow with the carbon-containing precursor. Suitable dilution gases may include argon (Ar), helium (He), hydrogen ($H_2$), nitrogen ($N_2$), ammonia ($NH_3$), noble gas such as krypton, xenon, or any combinations thereof. Ar, He, and $N_2$ may be used to control the density and deposition rate of the amorphous carbon layer. In some cases, the addition of $N_2$ and/or $NH_3$, or $H_2$ and/or $NH_3$, can be used to control the hydrogen ratio (e.g., carbon to hydrogen ratio) of the deposited amorphous carbon layer. In cases where alkynes such as acetylene ($C_2H_2$) or alkenes such as propylene is used as hydrocarbon source, the carrier gas may not be used during the deposition.

In Block 320, a plasma treatment may be performed to the metal-doped amorphous carbon layer. In one embodiment, the plasma treatment may be performed in the same chamber where the metal-doped amorphous carbon layer is formed. Alternatively, the plasma treatment may be performed in a different plasma process chamber.

According to embodiment of the present disclosure, the plasma treatment may be performed by positioning a substrate having a metal-doped amorphous carbon layer in a plasma process chamber, such as the plasma chamber of FIG. 1, flowing a treatment gas to the plasma process chamber and striking a plasma in the plasma process chamber. In one embodiment, the treatment gas may be argon (Ar), hydrogen ($H_2$), ammonia ($NH_3$), nitrogen ($N_2$), or combinations thereof.

During the plasma treatment, the process chamber may be maintained at a temperature between about 100° C. to about 500° C. The treatment gas may be flown to the process chamber at a flow rate between about 20 sccm to about 20,000 sccm. The chamber pressure may be between about 0.01 Torr to about 50 Torr. An RF power is applied to the treatment gas in the process chamber to generate plasma in the process chamber. In one embodiment, the RF power may be provided between about 100 Watts and about 3,000 Watts at a frequency of about 50 kHz to about 13.6 MHz. The plasma treatment may be performed for a duration between about 10 seconds to about 600 seconds.

In Block 330, a mask layer is formed over the treated metal-doped amorphous carbon layer. The mask layer may be similar to the mask layer 208 in FIGS. 2B-2D. The mask layer may be used to transfer a pattern to the metal-doped amorphous carbon layer. The mask layer may be formed immediately after the plasma treatment of Block 320 to achieve improved adhesion between the metal-doped amorphous carbon layer and the mask layer. In one embodiment, the mask layer may be performed immediately after the plasma treatment without exposing the substrate to an exterior environment. In one embodiment, the plasma treatment of Block 320 and the deposition of Block 330 may be performed in the same process chamber. Alternatively, the plasma treatment of Block 320 and the deposition of Block 330 may be performed in separate process chambers. For example, the plasma treatment of Block 320 and the deposition of Block 330 may be performed in two process chambers attached to a transfer chamber. Immediately after the plasma treatment in a first chamber, the substrate may be transferred from the first chamber to a second chamber through the transfer chamber for deposition of the mask layer.

The mask layer may be a silicon oxide layer, a silicon nitride layer, an amorphous silicon layer, or a layer of any suitable material that may serve as etching mask for the metal-doped amorphous carbon layer. In one embodiment, the mask layer may be a silicon oxide layer formed by reacting a first gas mixture comprising a silicon-containing precursor and a second gas mixture containing an oxidizing agent. The first gas mixture may comprise tetra-ethyl-orthosilicate (TEOS). In one embodiment, the first gas mixture may further comprise a carrier gas, such as helium (He) and/or nitrogen ($N_2$). The second gas mixture may comprise ozone ($O_3$). Optionally, the second gas mixture may comprise oxygen ($O_2$).

During deposition of the mask layer, the substrate may be maintained at a temperature between about 150° C. to about 850° C. The chamber pressure may be between about 1 torr to about 600 torr. In one embodiment, the flow rate of TEOS may be between about 500 mgm (milligrams/minute) to about 1500 mgm. The flow rate of helium may be between about 1000 sccm to about 3000 sccm. The flow rate of nitrogen may be between about 1000 sccm to about 9000 sccm. An ozone concentration in oxygen may be about 12.5 weight %. The flow rate of ozone/oxygen mixture may be between about 1000 sccm to about 6000 sccm. The above process parameters are for substrates having a diameter of 300 mm. The process parameters may be adjusted for substrate size when processing larger or smaller substrates. The helium (He) and nitrogen ($N_2$) may be provided to the deposition chamber at a flow ratio of helium:nitrogen within a range of about 1:1 to about 1:3.

In Block 340, a pattern may be first formed on the mask layer 208 as shown in FIG. 2C, and then transferred to the metal-doped amorphous carbon layer 204 as shown in FIG. 2D. An energy sensitive resist material may be deposited on the mask layer and a photolithographic process may be used to form a pattern in the energy sensitive resist material. An etch process may be performed to the mask layer 208 to form a pattern therein. Another etch process may be performed to transfer the pattern from the mask layer 208 to the metal-doped amorphous carbon layer 204. The mask layer 208 will then be removed and the metal-doped amorphous carbon layer 204 may be used as a hardmask to pattern material layers or a material stack underneath. After use, the metal-doped amorphous carbon layer 204 may be removed using a solution comprising hydrogen peroxide and sulfuric acid. One exemplary solution comprising hydrogen peroxide and sulfuric acid is known as Piranha solution or Piranha etch. The metal-doped amorphous carbon layer 204 may also be removed using etch chemistries containing oxygen and halogens (e.g. fluorine or chlorine), for example, $Cl_2/O_2$, $CF_4/O_2$, $Cl_2/O_2/CF_4$.

Results of Peeling Test

Pealing tests were performed to prove that embodiment of the present disclosure improves adhesion between a metal-doped amorphous carbon film and a silicon oxide film.

Peeling Test 1 is performed on a film stack without using the treatment method of the present disclosure. A metal-doped amorphous carbon film is first deposited on a substrate in a plasma-enhanced chemical vapor deposition (PECVD) chamber. A silicon oxide layer is then deposited on the metal-doped amorphous carbon layer. The film stack is scratched 10 times from left to right and 10 times from up to down to create a large cross hatch pattern. Clean room tape is then used to tape over and then peel off the cross hatch. Result of peeling test 1 indications a weak adhesion between the metal-doped amorphous carbon layer and the silicon oxide layer. A 4-point bending test shows that the adhesion energy between the metal-doped amorphous carbon layer and the silicon oxide layer is 3.9 $J/m^2$.

Peeling Test 2 is performed on a film stack formed according to the present disclosure. A metal-doped amorphous carbon film is first deposited on a substrate in a plasma-enhanced chemical vapor deposition (PECVD) chamber. A plasma treatment with Ar is employed just before the deposition of a silicon oxide layer on the metal-doped amorphous carbon layer. The film stack is scratched 10 times from left to right and 10 times from up to down to create a large cross hatch pattern. Clean room tape is then used to tape over and then peel off the cross hatch. Peeling-off is not observed in Peeling Test 2 indicating an improved adhesion between the metal-doped amorphous carbon layer and the silicon oxide layer. A 4-point bending test shows that the adhesion energy between the metal-doped amorphous carbon layer and the silicon oxide layer is 7.4 $J/m^2$.

Peeling Test 3 is performed on a film stack similar to the film stack of Peeling Test 2 except the silicon oxide layer is performed two days after the plasma treatment of the metal-doped amorphous carbon film. Peeling off is observed indicating an oxide layer or absorbed molecules are formed between plasma treatment and oxide deposition. The oxide layer or absorbed molecules may cause the peeling-off in the film stacks.

Peeling Test 4 is performed on a film stack similar to the film stack of Peeling Test 2 except the metal-doped amorphous carbon film is formed two days prior to the plasma treatment and deposition of the silicon oxide layer. Peeling off is not observed, which further proves that the plasma treatment immediately before depositing a silicon oxide layer improves adhesion between the metal-doped amorphous carbon film and silicon oxide film.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, comprising:
plasma treating a substrate having a transition metal-doped amorphous carbon layer, comprising:
flowing a treatment gas into a processing chamber, the treatment gas consisting of argon, hydrogen, nitrogen, ammonia, or a combination thereof;
forming a treatment plasma of the treatment gas; and
exposing the transition metal-doped amorphous carbon layer to the treatment plasma, wherein exposing the transition metal-doped amorphous carbon layer to the treatment plasma removes oxidized ligands from a surface thereof; and
depositing a mask layer on the plasma treated transition metal-doped amorphous carbon layer.

2. The method of claim 1, wherein the mask layer comprises one of silicon oxide, silicon nitride, amorphous silicon, and combinations thereof.

3. The method of claim 1, wherein the treatment gas consists of argon, hydrogen or a combination thereof.

4. The method of claim 1, wherein plasma treating the transition metal-doped amorphous carbon layer and depositing the mask layer thereon are performed in the same processing chamber.

5. The method of claim 2, wherein depositing the mask layer comprises:
flowing a first gas mixture comprising a silicon containing precursor; and
flowing a second gas mixture comprising an oxidizing agent.

6. The method of claim 5, wherein the first gas mixture comprises tetra-ethyl-ortho-silicate (TEOS), and the second gas mixture comprises ozone.

7. The method of claim 2, further comprising forming the transition metal-doped amorphous carbon layer by reacting a carbon-containing precursor and a transition metal-containing precursor.

8. The method of claim 7, wherein the transition metal-containing precursor is a gaseous halide of a transition metal.

9. The method of claim 7, wherein the transition metal-containing precursor is a transition metal organic compound comprising transition metal dialkylamido compounds and/or transition metal cyclopentadienyl compounds.

10. The method of claim 1, further comprising:
patterning the mask layer to form a plurality of openings disposed therethrough; and
patterning the transition metal-doped amorphous carbon layer through the plurality of openings formed in the mask layer.

11. The method of claim 1, wherein the transition metal-doped amorphous carbon layer has a thickness between about 300 Å and 5,000 Å.

12. The method of claim 11, wherein the thickness of the transition metal-doped amorphous carbon layer is between about 400 Å and about 2,000 Å.

13. The method of claim 1, wherein the transition metal-doped amorphous carbon layer is exposed to the treatment plasma for a duration between about 10 seconds and about 600 seconds.

14. The method of claim 1, wherein an adhesion energy between the transition metal-doped amorphous carbon layer and the mask layer deposited thereon is at least about 7.4 J/m$^2$.

15. A method of processing a substrate, comprising:
plasma treating a substrate having a transition metal-doped amorphous carbon layer of a thickness between about 300 Å and 5,000 Å disposed thereon, comprising:
flowing a non-oxygen containing treatment gas into a processing chamber, the non-oxygen treatment gas consisting of argon, hydrogen, nitrogen, ammonia, or a combination thereof;
forming a treatment plasma of the non-oxygen containing treatment gas; and
exposing the transition metal-doped amorphous carbon layer to the treatment plasma for between about 10 second and about 600 seconds, wherein exposing the transition metal-doped amorphous carbon layer to the treatment plasma removes oxidized ligands from a surface thereof; and
depositing a mask layer on the plasma treated transition metal-doped amorphous carbon layer, wherein the mask layer comprises a material selected from the group consisting of silicon oxide, silicon nitride, amorphous silicon, and combinations thereof, and wherein an adhesion energy between the transition metal-doped amorphous carbon layer and the mask layer deposited thereon is at least about 7.4 J/m$^2$.

16. The method of claim 15, further comprising:
patterning the mask layer to form a plurality of openings disposed therethrough; and
patterning the transition metal-doped amorphous carbon layer through the plurality of openings formed in the mask layer.

17. A method of processing a substrate, comprising:
plasma treating a substrate having a transition metal-doped amorphous carbon layer, comprising:
flowing a non-oxygen containing treatment gas into a processing chamber, wherein the non-oxygen containing treatment gas comprises argon, hydrogen, nitrogen, ammonia, or a combination thereof;
forming a treatment plasma of the non-oxygen containing treatment gas; and
exposing the transition metal-doped amorphous carbon layer to the treatment plasma, wherein exposing the transition metal-doped amorphous carbon layer to the treatment plasma removes oxidized ligands from a surface thereof; and
depositing a mask layer on the plasma treated transition metal-doped amorphous carbon layer.

18. The method of claim 17, wherein plasma treating the transition metal-doped amorphous carbon layer and depositing the mask layer thereon are performed in the same processing chamber.

19. The method of claim 17, wherein the mask layer comprises one of silicon oxide, silicon nitride, amorphous silicon, and combinations thereof.

20. The method of claim 17, further comprising:
patterning the mask layer to form a plurality of openings disposed therethrough; and
patterning the transition metal-doped amorphous carbon layer through the plurality of openings formed in the mask layer.

21. The method of claim 20, wherein an adhesion energy between the transition metal-doped amorphous carbon layer and the mask layer deposited thereon is at least about 7.4 J/m$^2$.

* * * * *

UNITED STATES PATENT AND TRADEMARK OFFICE
CERTIFICATE OF CORRECTION

PATENT NO. : 9,865,459 B2
APPLICATION NO. : 15/094512
DATED : January 9, 2018
INVENTOR(S) : Rui Cheng et al.

It is certified that error appears in the above-identified patent and that said Letters Patent is hereby corrected as shown below:

In the Claims

In Column 14, Line 6, in Claim 15, after "non-oxygen" insert -- containing --.

Signed and Sealed this
Seventeenth Day of April, 2018

Andrei Iancu
*Director of the United States Patent and Trademark Office*